United States Patent
Nakamura et al.

(10) Patent No.: US 6,503,769 B2
(45) Date of Patent: *Jan. 7, 2003

(54) SEMICONDUCTOR DEVICE AND METHOD FOR FABRICATING THE SAME

(75) Inventors: Shinji Nakamura, Osaka (JP); Masaaki Yuri, Osaka (JP); Kenji Orita, Osaka (JP)

(73) Assignee: Matsushita Electronics Corporation, Osaka (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/420,722

(22) Filed: Oct. 20, 1999

(65) Prior Publication Data

US 2002/0167018 A1 Nov. 14, 2002

(30) Foreign Application Priority Data

Oct. 26, 1998 (JP) .......................................... 10-303575

(51) Int. Cl.$^7$ .............................................. H01L 21/20
(52) U.S. Cl. ............................ 438/22; 438/46; 438/718
(58) Field of Search ............................... 438/22, 24, 42, 438/43, 44, 46, 47, 478, 483, 700, 701, 702, 706, 712, 718

(56) References Cited

U.S. PATENT DOCUMENTS

| | | | | |
|---|---|---|---|---|
| 5,650,641 A | * | 7/1997 | Sassa et al. | 257/88 |
| 5,776,792 A | * | 7/1998 | Naito et al. | 438/31 |
| 5,834,379 A | * | 11/1998 | Shealy et al. | 438/767 |
| 5,923,946 A | * | 7/1999 | Negley | 438/4 |
| 6,072,819 A | | 6/2000 | Shakuda | |
| 6,111,275 A | * | 8/2000 | Hata | 257/97 |

FOREIGN PATENT DOCUMENTS

| | | |
|---|---|---|
| DE | 197 08 989 | 9/1997 |
| JP | 6-19801 | 1/1994 |
| JP | 9-232681 | 9/1997 |
| JP | 9-312442 | 12/1997 |

OTHER PUBLICATIONS

European Search Report dated Sep. 25, 2000 for EP 99 12 0838.

C. B. Vartuli et al., Electron Cyclotron Resonance Plasma Etching of AlGaN in Cl$_2$/Ar and BCl$_3$/Ar Plasmas, The Slectrochemical Society, Inc., J. Electrochem Soc., vol. 144, No. 6, Jun. 1997, pp 2146–2149.

R. J. Shul et al., "Selective inductively coupled plasma etching of group–III nitrides in Cl$_2$–and BCl$_3$–based plasmas", The American Vacuum Society, J. Vac. Sci. Technol. A 16(3), May/Jun. 1998, pp 1621–1626.

C. Youtsey et al., "Smooth n–type GaN surfaces by photo-enhanced wet etching", Applied Physics Letters, vol. 72, No. 5, pp. 560–562, 1998.

L. H. Peng et al., "Deep ultraviolet enhanced wet chemical etching of gallium nitride", Applied Physics Letters, vol. 72, No. 8, pp. 939–941, 1998.

F. Ren et al., "Effect of Dry Etching on Surface Properties of III–Nitrides", Journal of Electronic Materials, vol. 36, No. 11, pp. 1287–1291, 1997.

S. Nunoue et al., "Reactive Ion Beam Etching and Overgrowth Process in the Fabrication of InGaN Inner Stripe Laser Diodes", Japan Journal of Applied Physics, vol. 37, pp. 1470–1473, 1998.

* cited by examiner

*Primary Examiner*—Savitri Mulpuri
(74) *Attorney, Agent, or Firm*—RatnerPrestia

(57) ABSTRACT

A semiconductor device includes a substrate, a multi-layer structure provided on the substrate, a first-conductive-type etch stop layer of a III nitride provided on the multi-layer structure, and a second-conductive-type first semiconductor layer of a III nitride provided on the etch stop layer. A molar fraction of Al is lower in a composition of the III nitride included in the first semiconductor layer than in a composition of the III nitride included in the etch stop layer.

4 Claims, 6 Drawing Sheets

PRIOR ART

SEMICONDUCTOR DEVICE AND METHOD FOR FABRICATING THE SAME

BACKGROUND OF THE INVENTION

1. Field of the Invention

The present invention relates to a semiconductor device of a nitride-based compound semiconductor and a method for fabricating the semiconductor device. More particularly, the present invention relates to a semiconductor laser device emitting blue/violet light having a wavelength of around 400 nm.

2. Description of the Related Art

A nitride-based compound semiconductor made of gallium nitride (GaN), aluminum nitride (AlN), indium nitride (InN), or a mixed crystal composed thereof has wide bandgap energy in a range of 1.9–6.2 eV, and is thus expected to be useful as a semiconductor material for a light-emitting or light-receiving device covering a range from visible light to ultraviolet light. In particular, a semiconductor laser device emitting a light having a wavelength of around 400 nm, such as that realized using this material, is expected to be a very feasible light source for a next-generation hyper-density optical disk, and the research and development thereof has been vigorously conducted throughout the world.

The practical use of such a semiconductor laser device as a light source for an optical disk critically requires the precision and uniformity of: thicknesses of a plurality of semiconductor layers included in the semiconductor laser device; and a structure of a waveguide, such as a buried structure, for achieving the single transverse mode oscillation. For a semiconductor laser device of a nitride-based compound semiconductor, in particular, it is important to use an etching technique which can control formation of the waveguide structure precisely and uniformly.

Some of conventional etching techniques for the nitride-based compound semiconductor will be described below.

One of the techniques is a dry etching technique using boron chloride ($BCl_3$) and nitrogen ($N_2$) as etching gases (F. Ren et al., Journal of Electronic Materials, Vol. 26, No. 11, 1997, pp. 1287–1291).

Another technique is an etching technique, so-called wet etching, in which a carrier-doped nitride-based compound semiconductor is etched by immersion in an aqueous solution of potassium hydroxide or phosphoric acid and illumination with light of larger energy than the bandgap energy of the nitride-based compound semiconductor (Japanese Laid-Open Publication No. 9-232681; C. Youtsey et al., Applied Physics Letters, Vol. 72, No. 5, 1998, pp. 560–562; and L.-H. Peng et al., Applied Physics Letters, Vol. 72, No. 8, 1998, pp. 939–941).

A nitride-based compound semiconductor laser device capable of obtaining the single transverse mode oscillation, which is fabricated using such techniques, is, for example, disclosed in Japanese Laid-Open Publication No. 6-19801. This semiconductor laser device will be described with reference to FIG. 5.

Referring to FIG. 5, the nitride-based compound semiconductor laser device includes a substrate 1, and further includes a buffer layer 2 of undoped GaN, an n-type contact layer 3 of n-type GaN, an n-type cladding layer 4 of n-type $Al_{0.1}Ga_{0.9}N$, an n-type light guiding layer 5 of n-type GaN, an active layer 6 being a multi-quantum-well layer produced by alternative formation of an $In_{0.15}Ga_{0.85}N$ well layer and an $In_{0.02}Ga_{0.98}N$ barrier layer, a p-type light guiding layer 7 of p-type GaN, and a first p-type cladding layer 8 of p-type $Al_{0.1}Ga_{0.9}N$, which are successively formed on the substrate 1. The nitride-based compound semiconductor laser device still further includes a groove structure 9 formed on the cladding layer 8, and a p-type contact layer 10 of p-type GaN formed on the groove structure 9. The groove structure 9 serves as part of a waveguide.

The groove structure 9 includes an n-type current blocking layer 12 of n-type $Al_{0.1}Ga_{0.9}N$ in which a groove stripe is formed, and a second p-type cladding layer 11 of p-type $Al_{0.5}Ga_{0.95}N$ formed on the current blocking layer 12.

A portion of a surface of the n-type contact layer 3 is exposed, and an n-type electrode 13 is formed on the exposed surface of the n-type contact layer 3. Also, a p-type electrode 14 is formed on the p-type contact layer 10.

A method of producing the groove structure 9 will now be described with reference to FIGS. 6A through 6C.

After the first p-type cladding layer 8 has been formed over the substrate 1, the n-type current blocking layer 12 is formed on the first p-type cladding layer 8. A mask 15 having an opening in the shape of a stripe with a predetermined width is attached on the n-type current blocking layer 12 (FIG. 6A).

Then, a portion of the n-type current blocking layer 12 corresponding to the opening of the mask 15 is removed by etching to form a groove (FIG. 6B). Subsequently, the mask 15 is removed. The second p-type cladding layer 11 is formed on the groove and the remaining n-type current blocking layer 12 (FIG. 6C).

The above-described conventional techniques have the following problems.

To provide satisfactory manufacturing yields of the nitride-based compound semiconductor laser device capable of the single transverse mode oscillation, it is critically important to control the shape and thickness of the groove structure 9. To achieve this end, it is necessary to precisely and uniformly control etching so as to obtain a precise and uniform depth of the groove resulting from the etching removal of the portion of the n-type current blocking layer 12 corresponding to the opening of the mask 15.

For conventional wet etching techniques, the above-mentioned reference discloses a technique in which an etch stop layer is used to stop etching at the etch stop layer. In this case, however, a layer to be etched and the etch stop layer are produced by changing the carrier densities thereof, although it is difficult to precisely and uniformly control the carrier densities. Therefore, the etching selectivity of the layer to be etched and the etch stop layer varies, which causes roughness on the etched surfaces of the layer to be etched and the etch stop layer.

For conventional dry etching techniques, an etching selectivity has not ben known with respect to the nitride-based compound semiconductor, so that it is not believed that an etch stop layer may be provided. In general, as the n-type current blocking layer 12 and the first p-type cladding layer 8 have the same or similar composition, etching does not stop at the n-type current blocking layer 12 and proceeds in the first p-type cladding layer 8. Accordingly, in the step of removing the n-type current blocking layer 12, it is difficult to precisely and uniformly control the etching depth.

Thus, it is difficult to provide satisfactory manufacturing yields of the nitride-based compound semiconductor laser device capable of the single transverse mode oscillation.

SUMMARY OF THE INVENTION

A semiconductor device of the present invention includes: a substrate; a multi-layer structure provided on the substrate;

a first-conductive-type etch stop layer of a III nitride provided on the multi-layer structure; and a second-conductive-type first semiconductor layer of a III nitride provided on the etch stop layer. A molar fraction of Al is lower in a composition of the III nitride included in the first semiconductor layer than in a composition of the III nitride included in the etch stop layer.

Accordingly, since the etch stop layer having a larger molar fraction of Al in the composition thereof than the first semiconductor layer is formed immediately under the first semiconductor layer, etching performed in the first semiconductor layer is substantially stopped at the etch stop layer.

In one embodiment of the present invention, the multi-layer structure includes a second semiconductor layer of a III nitride, a molar fraction of Al being lower in a composition of the III nitride included in the second semiconductor layer than in a composition of the III nitride included in the etch stop layer.

Accordingly, the second semiconductor layer has a higher refractive index than the etch stop layer.

In one embodiment of the present invention, the multi-layer structure includes an active layer.

Accordingly, a semiconductor device having a highly precise waveguide structure can be obtained.

In one embodiment of the present invention, the first semiconductor layer does not allow electrical current to pass therethrough, and a groove is provided along the <1, 1, −2, 0> direction in the first semiconductor layer, the groove reaching the etch stop layer.

Accordingly, the first semiconductor layer functions as a current blocking layer, thereby obtaining satisfactory crystal growth on the sloped sides of the groove.

In one embodiment of the present invention, in the semiconductor device, the second conductive-type may be different from the first conductive-type.

A method for fabricating a semiconductor device according to the present invention includes the steps of: forming a multi-layer structure on a substrates forming a first-conductive-type etch stop layer of a III nitride on the multi-layer structure; forming a second-conductive-type first semiconductor layer of a III nitride on the etch stop layer, a molar fraction of Al being lower in a composition of the III nitride included in the first semiconductor layer than in a composition of the III nitride included in the etch stop layer; and selectively removing at least a portion of the first semiconductor layer by vapor etching.

Accordingly, a difference in an Al molar fraction between the etch stop layer and the first semiconductor layer causes the etching selectivity, thereby making it possible to precisely and uniformly control the etching of the first semiconductor layer.

In one embodiment of the present invention, the vapor etching is performed using a gas mixture of boron chloride and nitrogen.

Accordingly, since the gas mixture of boron chloride and nitrogen is used in dry etching, the uniformity of etching can be further improved.

In one embodiment of the present invention, the vapor etching provides a groove along the <1, 1, −2, 0> direction in the first semiconductor layer.

Accordingly, satisfactory crystal growth can be obtained on the sloped sides of the groove provided along the <1, 1, −2, 0> direction in the first semiconductor layer.

In one embodiment of the present invention, in the method, the second conductive-type may be different from the first conductive-type.

Thus, the invention described herein makes possible the advantages of (1) providing a semiconductor laser having a more precise waveguide structure than the prior art; and (2) providing a method for fabricating such a semiconductor device.

These and other advantages of the present invention will become apparent to those skilled in the art upon reading and understanding the following detailed description with reference to the accompanying figures.

DESCRIPTION OF THE PREFERRED EMBODIMENTS

Hereinafter, an embodiment of the present invention will be described with reference to the accompanying drawings.

Figure 1:
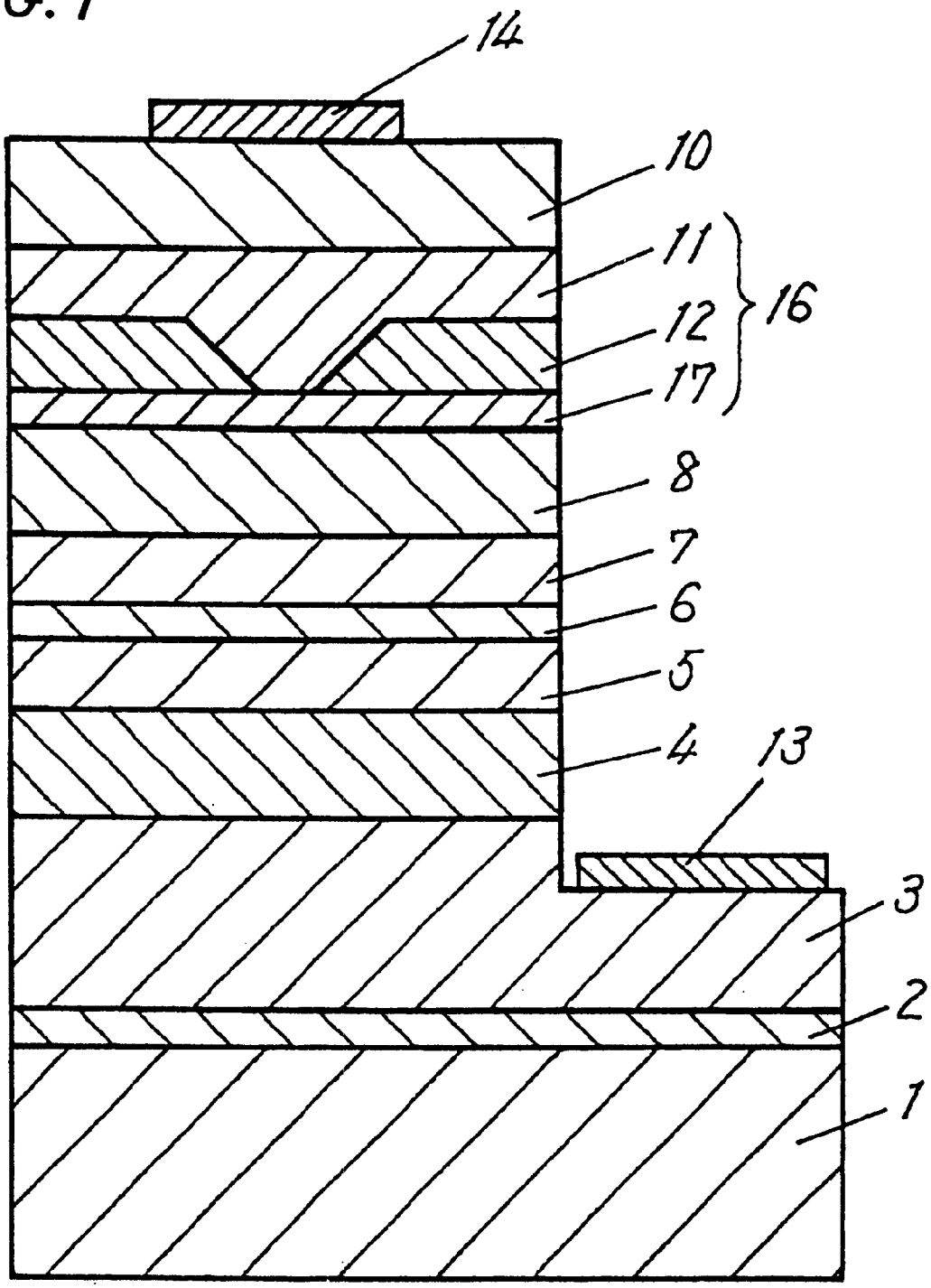
FIG. 1 is a cross-sectional view illustrating a semiconductor device according to the present invention.

FIG. 1 shows a cross-sectional view of a semiconductor light emitting device according to an embodiment of the present invention. As shown in FIG. 1, the semiconductor light emitting device includes a substrate 1 of, for example, sapphire having a (0, 0, 0, 1) plane as a primary surface, and further includes a buffer layer 2 of undoped GaN having a thickness of 300 Å, an n-type contact layer 3 of n-type GaN having a thickness of 2 $\mu$m, an n-type cladding layer 4 of n-type $Al_{0.1}Ga_{0.9}N$ having a thickness of 1 $\mu$m, an n-type light guiding layer 5 of n-type GaN having a thickness of 400 Å, an active layer 6 being a triple-quantum-well layer produced by alternative formation of three pairs of a well layer of $In_{0.15}Ga_{0.85}N$ having 30 Å and a barrier layer of $In_{0.02}Ga_{0.98}N$ having a thickness of 50 Å, a p-type light guiding layer 7 of p-type GaN having a thickness of 400 Å, and a first p-type cladding layer 8 of p-type $Al_{0.1}Ga_{0.9}N$ having a thickness of 0.1 $\mu$m, which are successively formed on a substrate 1. The semiconductor light-emitting layer still further includes a groove structure 16 on the first p-type cladding layer 8, and a p-type contact layer 10 of p-type GaN having a thickness of 1 $\mu$m formed on the groove structure 16. A portion of a surface of the n-type contact layer 3 is exposed, and an n-type electrode 13 is formed on the exposed surface of the n-type contact layer 3 by successively depositing titanium and gold, each to a thickness of 1 $\mu$m. A p-type electrode 14 is formed on the p-type contact layer 10 by successively depositing nickel and gold, each to a thickness of 0.1 $\mu$m.

The groove structure 16 includes an etch stop layer 17 of p-type $Al_{0.2}Ga_{0.8}N$ having a thickness of 500 Å, an n-type current blocking layer 12 of n-type $Al_{0.1}Ga_{0.9}N$ having a thickness of 0.4 $\mu$m in which a groove stripe in formed, and a second p-type cladding layer 11 of p-type $Al_{0.05}Ga_{0.98}N$ having a thickness of 1.4 $\mu m$ formed on the groove and the remaining n-type current blocking layer 12. In the groove structure 16, a groove is provided in the <1, 1, −2, 0> direction, and a width between the top edges of the groove is 4 $\mu m$. The <1, 1, −2, 0> direction of the groove leads to satisfactory crystal growth on the sloped sides of the groove.

The n-type contact layer 3, the n-type cladding layer 4, the n-type light guiding layer 5, and the n-type current blocking layer 12 are doped with silicon (Si) to have carrier densities of $5\times10^{15}$ $cm^{-3}$, $1\times10^{16}$ $cm^{-3}$, $5\times10^{17}$ $cm^{-3}$, and $1\times10^{18}$ $cm^{-3}$, respectively. The p-type light guiding layer 7, the first p-type cladding layer 8, the etch stop layer 17, the second p-type cladding layer 11, and the p-type contact layer 10 are doped with magnesium (Mg) to have carrier densities of $5\times10^{17}$ $cm^{-3}$, $1\times10^{18}$ $cm^{-3}$, $1\times10^{18}$ $cm^{-3}$, $1\times10^{18}$ $cm^{-3}$, and $5\times10^{17}$ $cm^{-3}$, respectively.

A plane perpendicular to the <1, 1, −2, 0> direction serves as an and facet of an oscillator (not shown).

As can be seen from the above-described configuration, the etch stop layer 12 that has a higher molar fraction of Al in the composition thereof than that of the n-type current blocking layer 12 is formed immediately under the n-type current blocking layer 12, so that the etching of the n-type current blocking layer 12 can be stopped at the etch stop layer 17. Therefore, it is possible to precisely and uniformly control the etching depth in the n-type current blocking layer 12, resulting in a more precise waveguide structure compared with the prior art.

Moreover, the etch stop layer 17 has a higher molar fraction of Al in the composition thereof than the first p-type cladding layer a which is formed immediately under the etch stop layer 17. As the Al molar fraction is increased, a refractive index decreases. Therefore, the etch stop layer 17 can confine light satisfactorily.

Figure 2A:
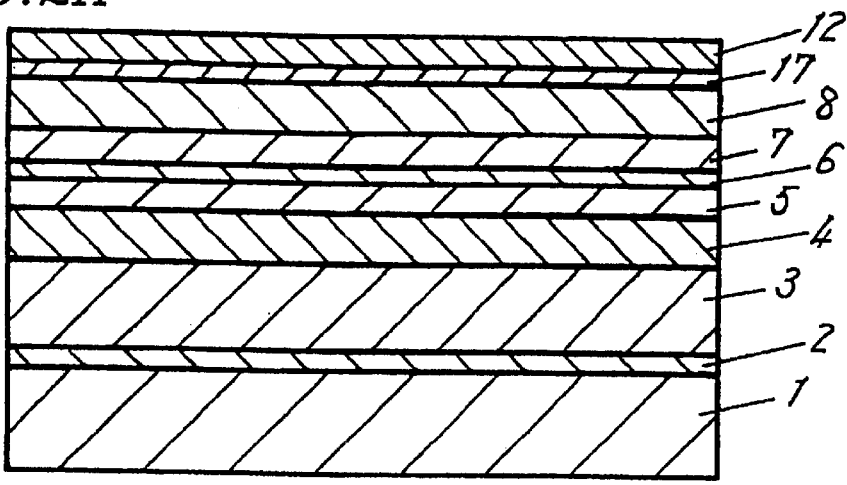
FIGS. 2A through 2C are cross-sectional views illustrating a method for fabricating the semiconductor device shown in FIG. 1.
Figure 2B:
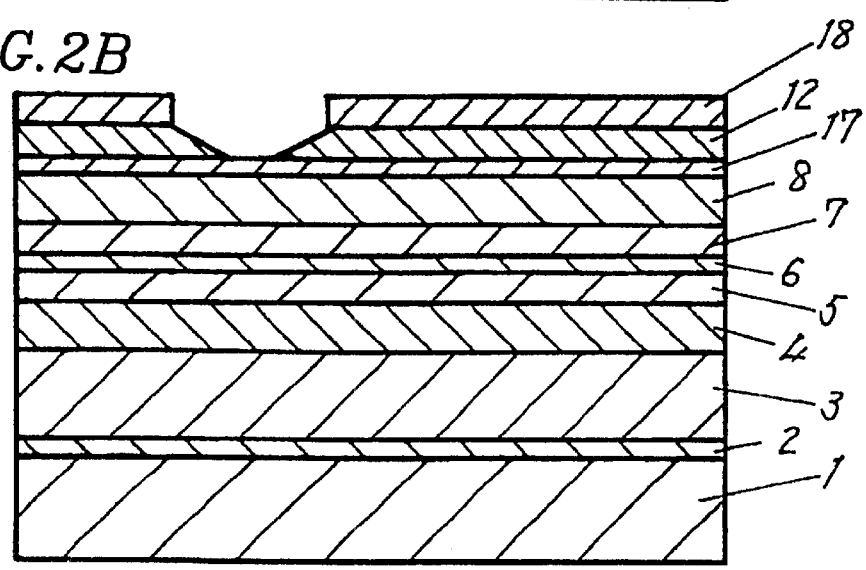
Figure 2C:
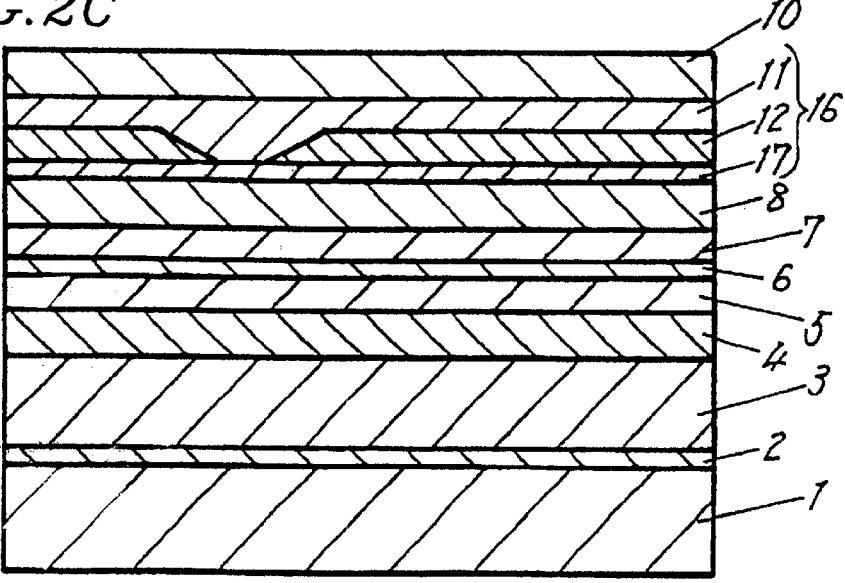

Now, a method for fabricating the semiconductor light-emitting device according to the embodiment of the present invention will be described with reference to FIGS. 2A through 2C.

The substrate 1 of sapphire is cleaned and put into a metal organic chemical vapor deposition (MOCVD) apparatus. The substrate 1 is heated to 1100° C. in an atmosphere of ammonia ($NH_3$) to remove impurities adsorbed on a surface of the substrate 1.

Subsequently, using trimethylgallium (TMG), trimethylalminum (TMA), trimethylindium (TMI), ammonia, silane ($SiH_4$), and cyclopentadienylmagnesium ($Cp_2Mg$), and hydrogen ($H_2$) or nitrogen ($N_2$) as carrier gases, the total pressure being 760 Torr, the above-described buffer layer 2, n-type contact layer 3, n-type cladding layer 4, n-type light guiding layer 5, active layer 6, p-type light guiding layer 7, first p-type cladding layer 8, etch stop layer 17, and n-type current blocking layer 12 are successively formed on the substrate 1 by MOCVD. The structure as shown in FIG. 2A in which the above-described layers are formed on the substrate 1 will be hereinafter referred to as a substrate structure. Crystal growth temperatures of the layers are 600° C. for the buffer layer 2, 1050° C. for the n-type contact layer 3, the n-type cladding layer 4, and the n-type light guiding layer 5, 800° C. for the active layer 6, and 1050° C. for the p-type light guiding layer 7, the first p-type cladding layer 8, the etch stop layer 17, and the n-type current blocking layer 12. Nitrogen is used as a carrier gas in formation of the active layer 6, and hydrogen is used as a carrier gas for the other layers.

Subsequently, a temperature of the substrate structure is cooled to room temperature and then brought out of the MOCVD apparatus.

Then, nickel is deposited on a surface of the n-type current blocking layer 12 to have a thickness of 1 $\mu m$. The nickel is photo-etched to form a mask 18 having an opening in the shape of a stripe having a width of 4 $\mu m$. The resultant substrate structure is put into a dry etching apparatus.

Reactive ion etching (hereinafter referred to an RIE) is performed in the dry etching apparatus where a pressure is 20 mTorr and an RF power is 150 W while supplying 10 sccm of $BCl_3$ and 5 sccm of nitrogen. A portion of the n-type current blocking layer 12 corresponding to the opening of the mask 18 is removed, thereby exposing the etch stop layer 17 (FIG. 2B).

Subsequently, the substrate structure is brought out of the dry etching apparatus followed by removal of the mask 18 with hydrochloric acid, and then cleaned.

The substrate structure is put into the MOCVD apparatus again. The second p-type cladding layer 11 is formed on the n-type current blocking layer 12 and the etch stop layer 17 by MOCVD, and the p-type contact layer 10 is further formed on the second p-type cladding layer 11 by MOCVD (FIG. 2C).

The substrate structure is brought out of the MOCVD apparatus, and then put into the dry etching apparatus again. The substrate structure is etched to remove a portion of the primary surface of the p-type contact layer 10 down to the n-type contact layer 3 so that a portion of the upper surface of the n-type contact layer 3 is exposed. Then, the p-type electrode 14 is formed on the p-type contact layer 10 by successively depositing nickel and gold, and the n-type electrode 13 is formed on the exposed surface of the n-type contact layer 3 by successively depositing titanium and gold.

Finally, the substrate structure is cleaved to produce an end facet of an oscillator, whereby the semiconductor light-emitting device is completed.

According to this fabrication method, the etch stop layer 17 that has a high molar fraction of Al in the composition thereof is formed immediately under the n-type current blocking layer 12, resulting in the etching selectivity for dry etching. Therefore, the etching can be substantially stopped at the interface between the n-type current blocking layer 12 and the etch stop layer 17. As described above, the difference in an Al molar fraction causes the etching selectivity, thereby making it possible to precisely and uniformly control the etching of the n-type current blocking layer 12. As a result, it is possible to more precisely control a structure of the waveguide compared with the prior art, thereby providing satisfactory manufacturing yields of the nitride-based compound semiconductor laser device capable of the single transverse mode oscillation.

Further, in the dry etching, a gas mixture of $BCl_3$ and nitrogen is used, so that the uniformity of etching is further improved.

Here, a description will be given of how the etching selectivity of the dry etching depends on the molar fraction of Al in the composition of the nitride-based compound semiconductor. This will illustrate the effect of the etch stop layer 17.

Figure 3:
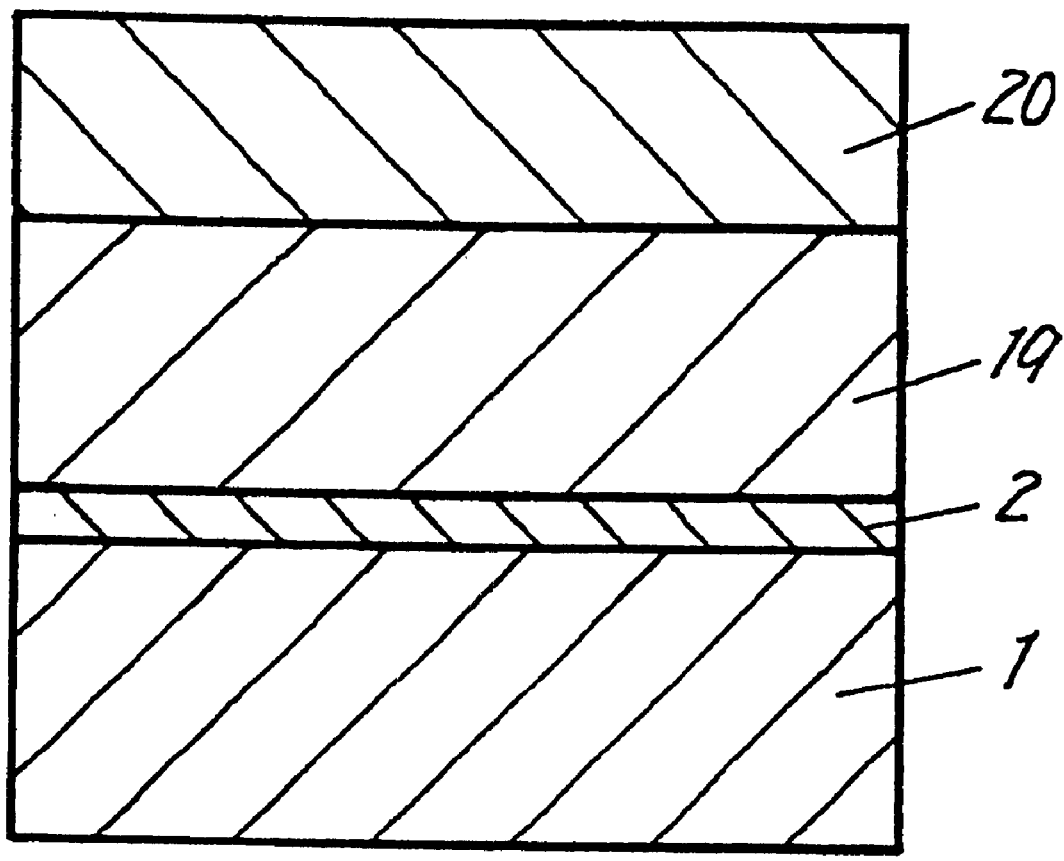
FIG. 3 is a cross-sectional view illustrating a structure of a nitride-based compound semiconductor device used in an experiment for evaluating an etch rate versus a molar fraction x of Al in $Al_xGa_{1-x}N$.

A nitride-based compound semiconductor device was fabricated, of which a cross-sectional view is shown in FIG. 3. The nitride-based compound semiconductor device includes a substrate 1 of sapphire, and further includes a buffer layer 2, a layer 19 of undoped GaN having a thickness of 2 $\mu m$, and a mixed crystal layer 20 of undoped $Al_xGa_{1-x}N$ having a thickness of 1 $\mu m$, which were successively formed on a substrate 1 by MOCVD. The nitride-based compound semiconductor device was put into a dry etching apparatus, and subjected to dry etching by RIE while supplying 10 sccm of BCl₃ and 5 sccm of nitrogen, where a pressure was 20 mTorr and an RF power was 150 W in the dry etching apparatus.

Figure 4:
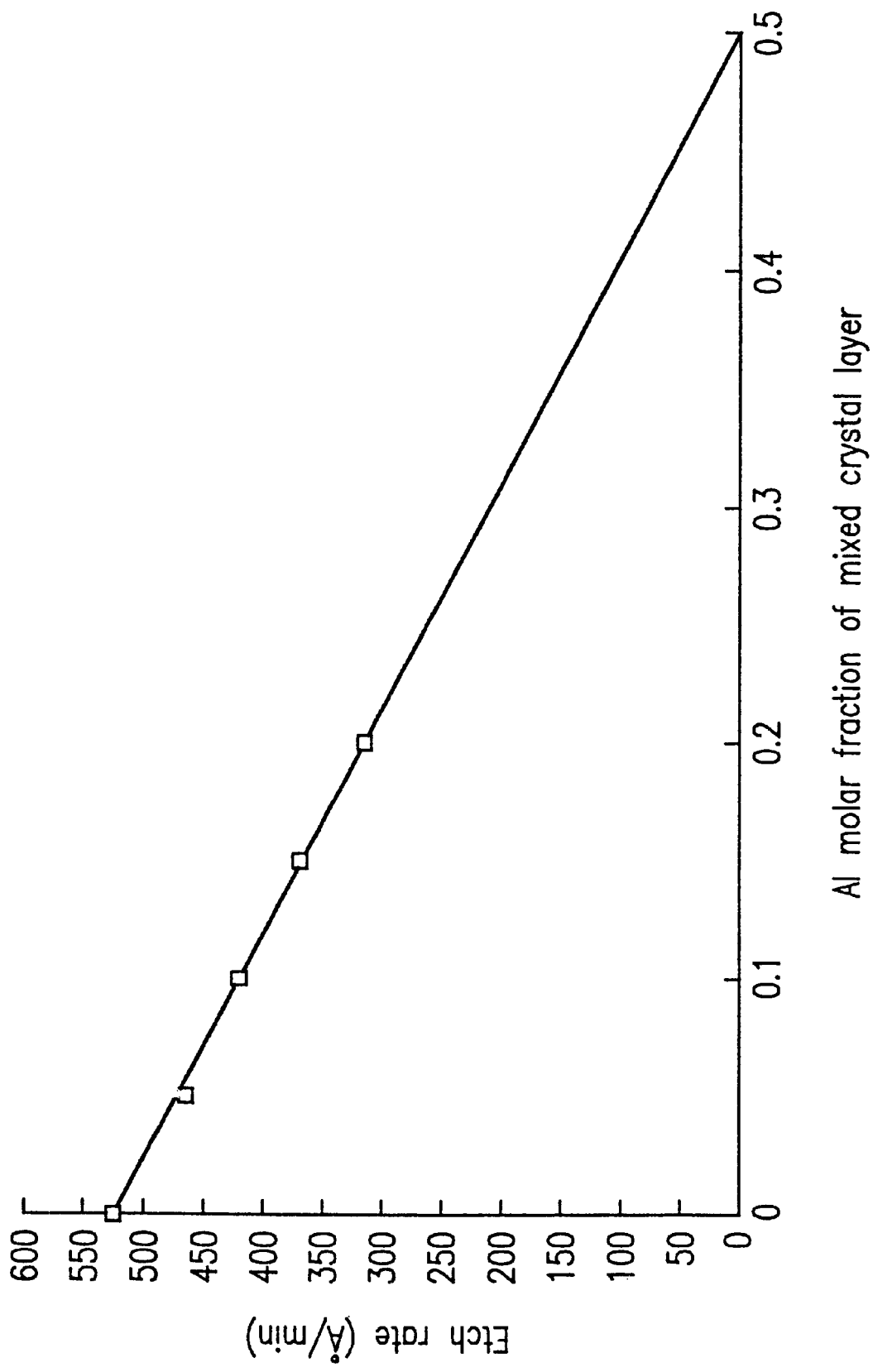
FIG. 4 is a graph showing the relationship between a molar friction x of Al in a mixed crystal layer of $Al_xGa_{1-x}N$ and an etch rate of dry etching.
Figure 5:
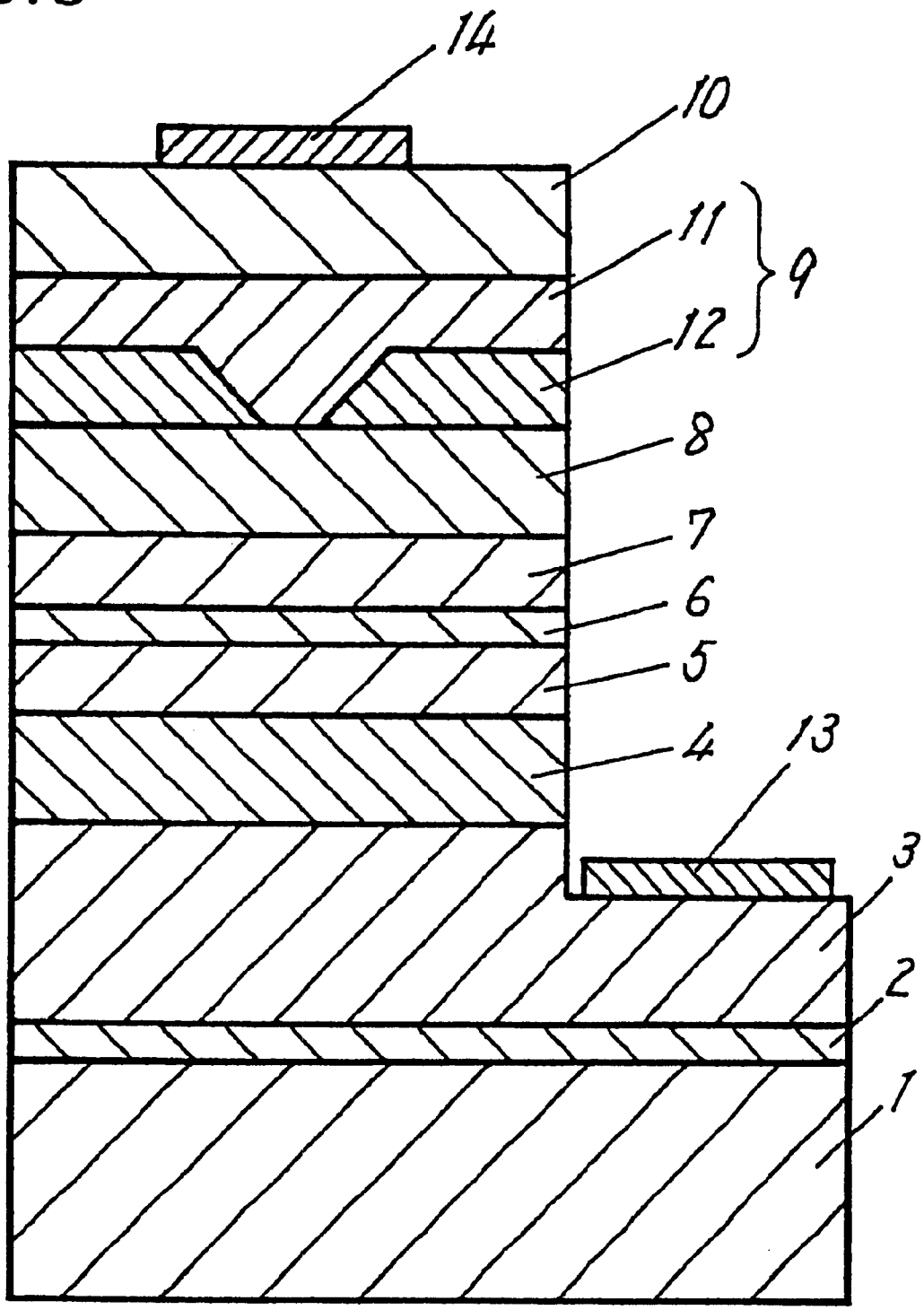
FIG. 5 is a cross-sectional view illustrating a conventional semiconductor light-emitting device.
Figure 6A:
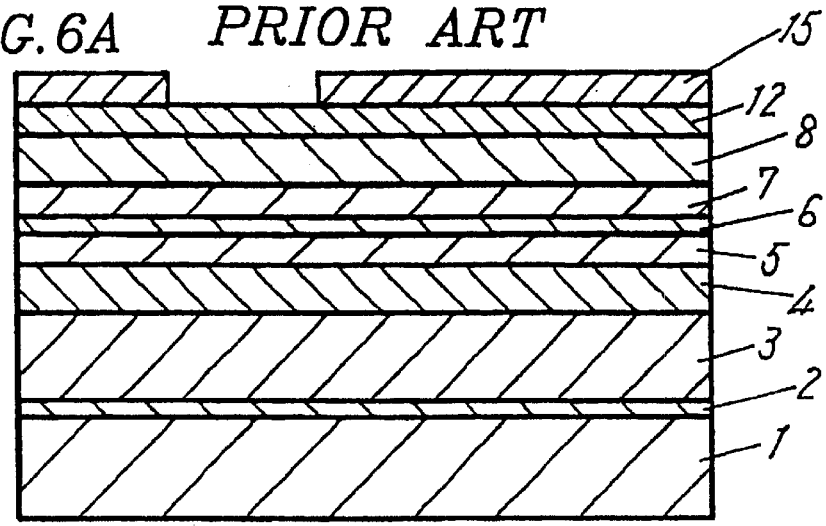
FIGS. 6A through 6C are cross-sectional views illustrating a method for fabricating the conventional semiconductor device shown in FIG. 5.
Figure 6B:
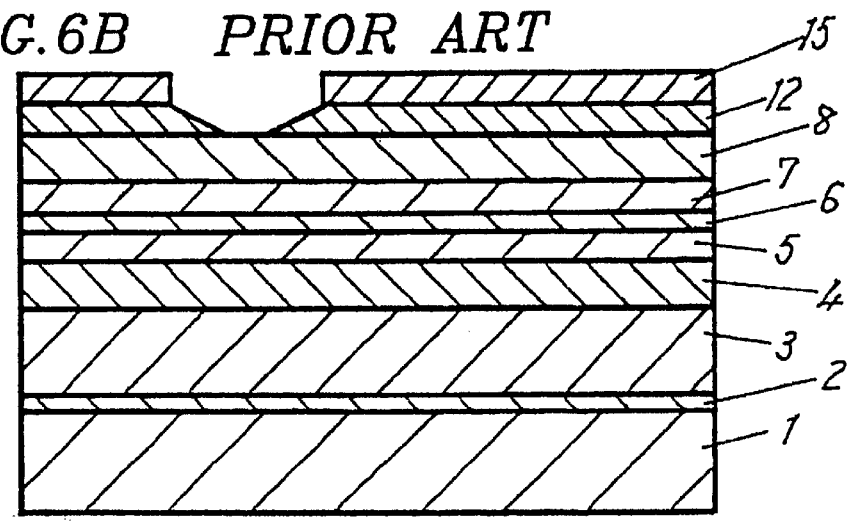
Figure 6C:
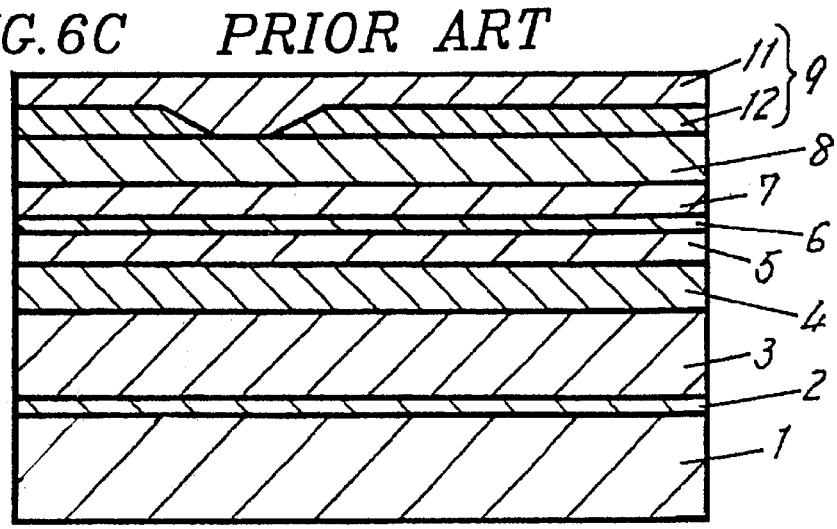

Etch rates of the mixed crystal layer 20 were evaluated while varying a molar fraction x of Al in the composition of the mixed crystal layer 20. The result is shown in FIG. 4. It can be seen from FIG. 4 that as the molar fraction x of Al in the composition is increased, the etch rate decreases. For example, at x=0.1, the etch rate is 430 Å/min, whereas at x=0.2, the etch rate is 310 Å/min. At x=0.5, the etch rate is 0 Å/min, which means that the mixed crystal layer 20 substantially is not etched.

The result shown in FIG. 4, for example, teaches that when the n-type current blocking layer 12 of which a molar fraction of Al in the composition thereof is 0.1 is formed on the etch stop layer 17 of which a molar fraction of Al in the composition thereof is 0.2, etching is substantially stopped at the interface between the etch stop layer 17 and the n-type current blocking layer 12.

The substrate 1 may be made of a material other than sapphire, such as, for example, silicon carbide (SiC) and GaN.

In the present application, the groove is formed in the n-type current blocking layer 12 by etching. Alternatively, by a similar etching technique, the second p-type cladding layer 11 in the shape of a ridge may be formed using a different mask, and the n-type current blocking layer 12 is formed on the sides of the ridge.

An described above, the exemplary embodiment of the present invention provides the semiconductor light-emitting device in which the active layer is formed under the etch stop layer. However, the structure of the device under the etch stop layer can be modified in such a way to fabricate semiconductor devices (e.g., a transistor) other than the semiconductor light-emitting device.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a semiconductor device, comprising the steps of:

forming a multi-layer structure on a substrate;

forming a first-conductive-type etch stop layer of a III nitride having an Al molar fraction of 0.2 or more on the multi-layer structure;

forming a second-conductive-type current blocking layer of a III nitride having an Al molar fraction which is smaller than that of the etch stop layer by 0.1 on the etch stop layer, a molar fraction of Al being lower in a composition of the III nitride included in the current blocking layer than in a composition of the III nitride included in the etch stop layer, wherein both the first-conductive-type etch stop layer and the current blocking layer include Al; and selectively removing at least a portion of the current blocking layer by vapor etching.

2. A method for fabricating a semiconductor device according to claim 1, wherein the current blocking layer is different from the first-conductive-type etch stop layer.

3. A method for fabricating a semiconductor device according to claim 1, wherein the vapor etching is performed using a gas mixture of boron chloride and nitrogen.

4. A method for fabricating a semiconductor device according to claim 1, wherein the vapor etching provides a groove along the <1, 1, −2, 0> direction in the first semiconductor layer.

* * * * *

UNITED STATES PATENT AND TRADEMARK OFFICE
CERTIFICATE OF CORRECTION

PATENT NO. : 6,503,769 B2  
DATED : January 7, 2003  
INVENTOR(S) : Shinji Nakamura et al.

Page 1 of 1

It is certified that error appears in the above-identified patent and that said Letters Patent is hereby corrected as shown below:

<u>Title page,</u>
Item [73], Assignee, should read as follows: -- Matsushita Electric Industrial Co., Ltd. --

Signed and Sealed this

Tenth Day of February, 2004

JON W. DUDAS
*Acting Director of the United States Patent and Trademark Office*